(12) United States Patent
Wong et al.

(10) Patent No.: US 12,006,569 B2
(45) Date of Patent: Jun. 11, 2024

(54) METHOD AND ARRANGEMENT FOR FORMING A TRANSITION METAL DICHALCOGENIDE LAYER

(71) Applicant: Agency for Science, Technology and Research, Singapore (SG)

(72) Inventors: Swee Liang Wong, Singapore (SG); Yee Fun Lim, Singapore (SG); Dongzhi Chi, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 165 days.

(21) Appl. No.: 17/437,013

(22) PCT Filed: Mar. 11, 2020

(86) PCT No.: PCT/SG2020/050129
§ 371 (c)(1),
(2) Date: Sep. 7, 2021

(87) PCT Pub. No.: WO2020/185164
PCT Pub. Date: Sep. 17, 2020

(65) Prior Publication Data
US 2022/0178018 A1    Jun. 9, 2022

(30) Foreign Application Priority Data
Mar. 14, 2019 (SG) .......................... 10201902303S

(51) Int. Cl.
*C23C 16/455*   (2006.01)
*C23C 16/30*    (2006.01)
(Continued)

(52) U.S. Cl.
CPC ........ *C23C 16/305* (2013.01); *C23C 16/4401* (2013.01); *C23C 16/4481* (2013.01); *C23C 16/455* (2013.01)

(58) Field of Classification Search
CPC ..... C23C 16/455; C23C 16/305; C30B 25/10; C30B 25/14
See application file for complete search history.

(56) References Cited

U.S. PATENT DOCUMENTS

| 5,322,615 | A  | * | 6/1994 | Holtermann | ........... | C10G 69/08 |
|-----------|----|---|--------|------------|-------------|------------|
|           |    |   |        |            |             | 208/91     |
| 11,293,869 | B2 | * | 4/2022 | Li | .......................... | C23C 14/24 |

(Continued)

FOREIGN PATENT DOCUMENTS

| WO | WO-2015031461 A1 | * | 3/2015 | ............. | C23C 14/12 |
| WO | WO-2018045271 A1 | * | 3/2018 | ......... | C23C 14/0021 |

OTHER PUBLICATIONS

Supplementary Information as an attachment of the prior IDS file YU et al., "Wafer-Scale Growth and Transfer of Highly-Oriented Monolayer MoS2 Continuous Films," ACS Nano, vol. 11, No. 12, 2017, pp. 12001-12007. (Year: 2017).*

(Continued)

*Primary Examiner* — Aiden Lee
(74) *Attorney, Agent, or Firm* — Shackelford, McKinley & Norton, LLP

(57) ABSTRACT

A method of forming a transition metal dichalcogenide layer on a substrate is provided. The method may include providing a transition metal oxide, a chalcogen source, a non-gaseous chalcogen scavenger, and a substrate, wherein the substrate is disposed downstream of the transition metal oxide and the chalcogen source, and wherein the non-gaseous chalcogen scavenger is disposed in proximity to the transition metal oxide; generating vapors of the transition metal oxide and vapors of the chalcogen source, wherein the non-gaseous chalcogen scavenger reacts preferentially with the vapors of the chalcogen source; disposing the vapors generated from the transition metal oxide and the chalcogen source on the substrate; and reacting the vapors of the (Continued)

transition metal oxide and the chalcogen source on the substrate to obtain the transition metal dichalcogenide layer on the substrate. In one embodiment, the transition metal oxide is molybdenum trioxide ($MoO_3$), the chalcogen source is sulfur, the non-gaseous chalcogen scavenger is nickel and the transition metal dichalcogenide is molybdenum disulfide ($MoS_2$). An arrangement for forming a transition metal dichalcogenide layer on a substrate is also provided.

8 Claims, 9 Drawing Sheets

(51) Int. Cl.
    *C23C 16/44*         (2006.01)
    *C23C 16/448*       (2006.01)

(56) References Cited

U.S. PATENT DOCUMENTS

| | | | | |
|---|---|---|---|---|
| 11,538,682 | B2* | 12/2022 | Chiu | H01L 21/02365 |
| 11,708,633 | B2* | 7/2023 | Byun | H01L 21/02568 |
| | | | | 427/255.32 |
| 2017/0330748 | A1* | 11/2017 | Pickett | H01L 21/0262 |
| 2020/0388546 | A1* | 12/2020 | Horikiri | H01L 21/0254 |

OTHER PUBLICATIONS

International Search Report for International Application No. PCT/SG2020/050129 dated Jun. 11, 2020, pp. 1-3.
Written Opinion of the International Searching Authority for International Application No. PCT/SG2020/050129 dated Jun. 11, 2020, pp. 1-5.
Wang et al., "Electronic Devices and Circuits Based on Wafer-Scale Polycrystalline Monolayer MoS2 by Chemical Vapor Deposition," Advanced Electronic Materials, vol. 5, No. 8, Jun. 3, 2019, pp. 1-10.
Tu et al., "Synthesis of Large Monolayer Single Crystal MoS2 Nanosheets with Uniform Size Through a Double-Tube Technology," Applied Physics Letters, vol. 109, 223101, 2016, pp. 1-4.
Yu et al., "Wafer-Scale Growth and Transfer of Highly-Oriented Monolayer MoS2 Continuous Films," ACS Nano, vol. 11, No. 12, 2017, pp. 12001-12007.
Yang et al., "Batch Production of 6-inch Uniform Monolayer Molybdenum Disulfide Catalyzed by Sodium in Glass," Nature Communications, vol. 9, No. 979, 2018, pp. 1-10.
Suenaga et al., "Surface-Mediated Aligned Growth of Monolayer MoS2 and In-Plane Heterostructures with Graphene on Sapphire," ACS Nano, vol. 12, No. 10, 2018, pp. 10032-10044.

* cited by examiner

METHOD AND ARRANGEMENT FOR FORMING A TRANSITION METAL DICHALCOGENIDE LAYER

CROSS-REFERENCE TO RELATED APPLICATION

This application claims the benefit of priority of Singapore patent application no. 10201902303S filed on 14 Mar. 2019, the contents of which being hereby incorporated by reference in its entirety for all purposes.

TECHNICAL FIELD

The invention relates to transition metal dichalcogenide, and in particular, to a method and an arrangement for forming a transition metal dichalcogenide layer on a substrate.

BACKGROUND

Two-dimensional (2D) materials are a class of materials that can be as thin as a single layer of atoms. Advantageously, some two-dimensional materials, for example, layered materials such as graphene and transition metal dichalcogenides (TMDC), are highly durable and flexible, while maintaining a high conductivity.

One member of transition metal dichalcogenides, molybdenum disulfide ($MoS_2$), is of particular interest as it is a semiconductor. Being two-dimensional, the physical properties of $MoS_2$ may change drastically with the number of layers that it is made up of.

When $MoS_2$ exists as a single layer, it may possess a direct electronic band gap, having potential applications in optoelectronics and valleytronics. As the number of $MoS_2$ layers increases to two or more, the electronic band gap changes from a direct to an indirect one. It is therefore important to have control over thickness of $MoS_2$ layers, and be able to deposit them over large areas, such as on a wafer scale, for commercial applications.

Even though a technique known as chemical vapor deposition (CVD) may be used to deposit $MoS_2$, problems remain with achieving regular precursor supply for homogenous growth of the films. As such, this limits the homogeneity in thickness and area of the final deposited $MoS_2$ single layer.

Accordingly, there remains a need for an improved method to prepare a transition metal dichalcogenide that overcomes or at least alleviates one or more of the above-mentioned problems.

SUMMARY

According to a first aspect, there is provided a method of forming a transition metal dichalcogenide layer on a substrate, the method comprising:
  providing a transition metal oxide, a chalcogen source, a non-gaseous chalcogen scavenger, and a substrate, wherein the substrate is disposed downstream of the transition metal oxide and the chalcogen source, and wherein the non-gaseous chalcogen scavenger is disposed in proximity to the transition metal oxide;
  generating vapors of the transition metal oxide and vapors of the chalcogen source, wherein the non-gaseous chalcogen scavenger reacts preferentially with the vapors of the chalcogen source;
  disposing the vapors generated from the transition metal oxide and the chalcogen source on the substrate; and
  reacting the vapors of the transition metal oxide and the chalcogen source on the substrate to obtain the transition metal dichalcogenide layer on the substrate.

According to a second aspect, there is provided an arrangement for forming a transition metal dichalcogenide layer on a substrate, the arrangement comprising:
  a transition metal oxide and a chalcogen source;
  a substrate disposed downstream of the transition metal oxide and the chalcogen source; and
  a non-gaseous chalcogen scavenger disposed in proximity to the transition metal oxide.

BRIEF DESCRIPTION OF THE DRAWINGS

In the drawings, like reference characters generally refer to the same parts throughout the different views. The drawings are not necessarily drawn to scale, emphasis instead generally being placed upon illustrating the principles of various embodiments. In the following description, various embodiments of the invention are described with reference to the following drawings.

DESCRIPTION

Figure 1A:
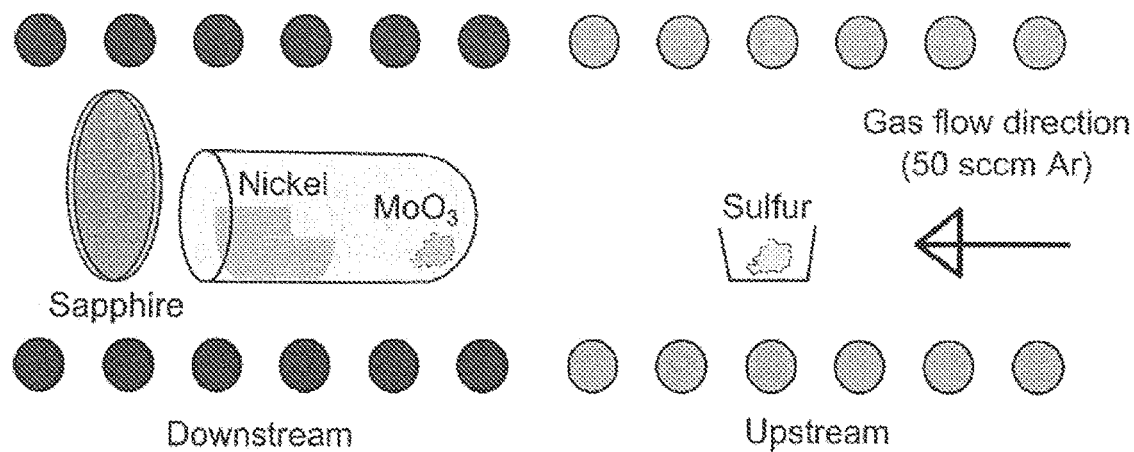
FIG. 1A is a schematic diagram showing an arrangement which may be used for forming a transition metal dichalcogenide layer on a substrate according to embodiments disclosed herein. In the embodiment shown, the arrangement may be used as a set-up for a furnace. Molybdenum trioxide ($MoO_3$) is an example of a transition metal oxide; sulfur is an example of a chalcogen source; nickel is an example of a non-gaseous chalcogen scavenger; and sapphire is an example of a substrate. The nickel may be in the form of a nickel foam or nickel powder. Both the nickel and the $MoO_3$ are contained in a closed end quartz tube, which may function like a chamber to prevent direct exposure of the $MoO_3$ to the sulfur. The nickel is arranged in proximity to the $MoO_3$, and disposed at an opening of the quartz tube. Assisted by flow of an inert gas such as argon or nitrogen, sulfur vapor, which may be generated by heating the sulfur, may be transported downstream and be disposed on the sapphire substrate. Although the gas flow rate is indicated as 50 sccm in the figure, any suitable gas flow rate may be used. Similarly, $MoO_3$ vapor, which may be generated by heating the $MoO_3$, may flow out of the quartz cylinder and be disposed on the sapphire substrate. The $MoO_3$ vapor may react with the sulfur vapor to form a molybdenum disulfide ($MoS_2$) layer on the sapphire substrate. By arranging the nickel at an opening of the quartz tube in proximity to the $MoO_3$, further as nickel reacts preferentially with sulfur, it is able to function as a sulfur trap to minimize exposure of $MoO_3$ to sulfur before the $MoO_3$ evaporates, thereby preventing premature reduction of $MoO_3$.

The following detailed description refers to the accompanying drawings that show, by way of illustration, specific details and embodiments in which the invention may be practised. These embodiments are described in sufficient detail to enable those skilled in the art to practise the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

According to embodiments disclosed herein, a transition metal oxide and a chalcogen source may be heated to form vapors of the transition metal oxide and the chalcogen source. To prevent vapors of the chalcogen source from reducing the pre-vaporized transition metal oxide, a non-gaseous chalcogen scavenger may be placed in proximity to or alongside the pre-vaporized transition metal oxide, so that the non-gaseous chalcogen scavenger reacts preferentially with vapors of the chalcogen source. In so doing, the pre-vaporized transition metal oxide is not reduced. Given that reduced transition metal oxide has lower vapor pressure and does not contribute to formation of transition metal dichalcogenide, by preventing the pre-vaporized transition metal oxide from being reduced, this may circumvent issues relating to inconsistency in vapor flow of the transition metal oxide. Using a method disclosed herein, there may be improved consistency in precursor supply for forming transition metal dichalcogenide layer on a substrate, which translate into formation of a more homogeneous transition metal dichalcogenide layer.

With the above in mind, various embodiments disclosed herein relate to a method of forming a transition metal dichalcogenide layer on a substrate.

The term "transition metal" as used herein refers to a metal in Group 3 to 12 of the Periodic Table of Elements, such as titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg); a lanthanide such as europium (Eu), gadolinium (Gd), lanthanum (La), ytterbium (Yb), and erbium (Er); or a post-transition metal such as aluminium (Al), gallium (Ga), indium (In), thallium (Tl), tin (Sn), lead (Pb), and bismuth (Bi).

The terms "chalcogenide" or "chalcogen" as used herein refers to chemical elements in Group 16 of the Periodic Table of Elements, and more particularly to sulfur (S), selenium (Se), and tellurium (Te).

Accordingly, the term "transition metal dichalcogenide layer" as used herein refers to a layer comprising or consisting of a transition metal dichalcogenide, such as a disulfide, a diselenide, and/or a ditelluride of one or more of the above-mentioned transition metals.

In various embodiments, the transition metal dichalcogenide is a transition metal disulfide.

In various embodiments, the transition metal dichalcogenide is a disulfide, a diselenide, and/or a ditelluride of a metal selected from Group 4 to 6 or Group 14 of the Periodic Table of Elements.

In various embodiments, the transition metal dichalcogenide is a disulfide of a metal selected from Group 4, Group 6, or Group 14 of the Periodic Table of Elements.

In some embodiments, the transition metal dichalcogenide is selected from the group consisting of molybdenum disulfide (MoS$_2$), tungsten disulfide (WS$_2$), chromium disulfide ($CrS_2$), titanium disulfide ($TiS_2$), hafnium disulfide ($HfS_2$), zirconium disulfide ($ZrS_2$), tin disulfide ($SnS_2$), and a combination thereof.

In some embodiments, the transition metal dichalcogenide comprises molybdenum disulfide ($MoS_2$), tungsten disulfide ($WS_2$), or a combination thereof.

In specific embodiments, the transition metal dichalcogenide layer comprises or consists of molybdenum disulfide ($MoS_2$).

The method of forming a transition metal dichalcogenide layer on a substrate according to embodiments disclosed herein comprises providing a transition metal oxide, a chalcogen source, a non-gaseous chalcogen scavenger, and a substrate.

The transition metal oxide may act as a precursor for forming the transition metal dichalcogenide layer, and may be an oxide of one or more of the above-mentioned transition metal that is used to form the transition metal dichalcogenide layer.

In various embodiments, the transition metal oxide is an oxide of a metal selected from Group 4 to 6 or Group 14 of the Periodic Table of Elements, such as an oxide of molybdenum, tungsten, chromium, titanium, hafnium, zirconium, and/or tin.

In some embodiments, the transition metal oxide is selected from the group consisting of molybdenum oxide, tungsten oxide, chromium oxide, tin oxide, titanium dioxide, hafnium oxide, zirconium oxide, and a combination thereof. In specific embodiments, the transition metal oxide comprises molybdenum oxide, tungsten oxide, or a combination thereof.

Depending on valency of the transition metal, the transition metal oxide may be in the form of a transition metal dioxide or a transition metal trioxide. In various embodiments, the transition metal oxide comprises a transition metal trioxide. For example, for forming a transition metal dichalcogenide layer comprising molybdenum disulfide ($MoS_2$), the transition metal oxide may comprise or consist of molybdenum trioxide ($MoO_3$).

Generally, the transition metal oxide is a solid, until heated to a certain temperature, whereby it vaporizes to form vapors of the transition metal oxide. The temperature whereby the transition metal oxide vaporizes may be transition metal oxide specific. As such, the term "pre-vaporized transition metal oxide" may be used herein to denote transition metal oxide which are in the solid form.

Besides the transition metal oxide, a chalcogen source, which acts as a precursor for forming the transition metal dichalcogenide layer, is also provided in a method of forming a transition metal dichalcogenide layer according to embodiments disclosed herein.

Depending on the type of transition metal dichalcogenide layer being formed, the chalcogen source may comprise sulfur, selenium, tellurium, or a combination thereof. In various embodiments, the chalcogen source comprises or consists of sulfur.

As in the case for the transition metal oxide, generally, the chalcogen source is a solid, until heated to a certain temperature (which may be chalcogen source specific), whereby it vaporizes to form vapors of the chalcogen source.

As mentioned above, the transition metal oxide and the chalcogen source act as precursors for forming a transition metal dichalcogenide layer on a substrate. The term "substrate" refers to any suitable support upon which the transition metal dichalcogenide layer may be formed. Examples of material that may be used for the substrate include, but are not limited to, metals, ceramics, semiconductors, glasses, and/or polymers.

In various embodiments, the substrate comprises sapphire, silicon, silicon dioxide, gallium nitride, aluminium nitride, a metal such as copper, a ceramic such as mica, or a combination thereof. In some embodiments, the substrate comprises or consists of sapphire, silicon, and/or silicon dioxide.

For forming a transition metal dichalcogenide layer on the substrate, vapors of the transition metal oxide and the chalcogen source are generated and disposed on the substrate, whereby reaction between the transition metal oxide and chalcogen source vapors takes place on the substrate to form the transition metal dichalcogenide layer. The method may be carried out in an inert environment, which may be provided, for example, in an enclosure.

In various embodiments, the substrate is disposed downstream of the transition metal oxide and the chalcogen source. The term "downstream" as used herein means that the substrate is arranged or positioned in a manner which allows vapors that may be generated from the transition metal oxide and the chalcogen source to reach or to be transported to a surface of the substrate, so that reaction between the vapors may take place to form the transition metal dichalcogenide layer on the substrate. Conversely, this means that the chalcogen source and the transition metal oxide are disposed upstream to the substrate.

According to embodiments disclosed herein, a non-gaseous chalcogen scavenger is disposed in proximity to the transition metal oxide. The non-gaseous chalcogen scavenger may, for example, be disposed alongside the transition metal oxide, or be disposed between the substrate and the chalcogen source. In some embodiments, the transition metal oxide and the non-gaseous chalcogen scavenger are disposed between the substrate and the chalcogen source. As used herein, the term "chalcogen scavenger" refers to a compound or element which is capable of capturing chalcogen atoms or ions to precipitate chalcogenides as a by-product. A suitable chalcogen scavenger may be one which is able to react preferentially, as compared to a transition metal oxide, with the chalcogen atoms or ions to precipitate chalcogenide as a by-product. In various embodiments, the chalcogenide by-product does not decompose or disintegrate at the process conditions, hence foreign elements are not introduced into the transition metal dichalcogenide layer which is being formed.

Advantageously, by providing a chalcogen scavenger in proximity to or alongside the transition metal oxide, this may minimize or even prevent exposure of the pre-vaporized transition metal oxide to chalcogen. By the phrase "in proximity to", this means that chalcogen scavenger is arranged close enough to the transition metal oxide to reduce incidence, or prevent premature reduction, of the transition metal oxide by vapors from the chalcogen source. In some embodiments, the chalcogen scavenger is arranged or disposed at a distance that is about 10 cm or less away from the transition metal oxide, such as 10 cm or less, 9 cm or less, 8 cm or less, 7 cm or less, 6 cm or less, 5 cm or less, 4 cm or less, 3 cm or less, 2 cm or less, or 1 cm or less, from the transition metal oxide. The chalcogen scavenger may be disposed at any suitable position with respect to the transition metal oxide, so long as it is able to reduce incidence, or prevent premature reduction, of the transition metal oxide prior to its vaporization. For example, in addition to or apart from the chalcogen scavenger being of a material which reacts preferentially with chalcogen, the chalcogen scavenger may react preferentially with the vapors of the chalcogen source due to flow path of the vapors of the chalcogen source being directed to the chalcogen scavenger first, before reaching, if at all, to the pre-vaporized transition metal oxide.

In various embodiments, providing the transition metal oxide, the chalcogen source, the non-gaseous chalcogen scavenger, and the substrate comprises disposing the non-gaseous chalcogen scavenger upstream of the transition metal oxide with respect to intended flow of vapors of the chalcogen source. Since the non-gaseous chalcogen scavenger is disposed or arranged upstream of the transition metal oxide with respect to intended flow of vapors of the chalcogen source, this allows or ensures that vapors, which may be generated from the chalcogen source, may be preferentially reacted with the non-gaseous chalcogen scavenger.

In various embodiments, the non-gaseous chalcogen scavenger comprises or consists of nickel.

In various embodiments, the non-gaseous chalcogen scavenger is a solid, and may furthermore be in the form of a powder or a foam.

The method according to various embodiments comprises generating vapors of the transition metal oxide and vapors of the chalcogen source, wherein the non-gaseous chalcogen scavenger reacts preferentially with the vapors of the chalcogen source.

Generating vapors of the transition metal oxide and vapors of the chalcogen source may comprise heating the transition metal oxide and the chalcogen source to their respective temperature for vaporization. Heating the transition metal oxide for vaporizing the transition metal oxide may be carried out at a temperature in the range of about 650° C. to about 950° C., such as about 700° C. to about 950° C., about 750° C. to about 950° C., about 800° C. to about 950° C., about 650° C. to about 900° C., about 700° C. to about 900° C., about 700° C. to about 800° C., about 740° C. to about 760° C., or about 750° C.

Heating the transition metal oxide for vaporizing the transition metal oxide may comprise heating for a time period which is sufficient to form a continuous transition metal dichalcogenide layer on the substrate. This may comprise heating the transition metal oxide for at least 13 minutes, such as at least 15 minutes, at least 30 minutes, at least 60 minutes, or for a time period in the range of about 13 minutes to about 60 minutes, about 13 minutes to about 30 minutes, or about 13 minutes to about 15 minutes.

In various embodiments, heating the transition metal oxide further comprises drying the transition metal oxide before vaporizing the transition metal oxide.

Drying the transition metal oxide may be carried out at a temperature which is sufficient to vaporize moisture that is adsorbed on the transition metal oxide. This may be carried out so that the moisture does not adversely affect quality of the transition metal dichalcogenide layer that is formed on the substrate.

A suitable drying temperature may be in the range of about 100° C. to about 300° C., such as about 150° C. to about 300° C., about 200° C. to about 300° C., about 250° C. to about 300° C., about 100° C. to about 250° C., about 100° C. to about 200° C., about 100° C. to about 150° C., about 240° C. to about 260° C., or about 250° C.

In various embodiments, drying the transition metal oxide is carried out at a temperature in the range of about 200° C. to about 300° C. In specific embodiments, drying the transition metal oxide is carried out at a temperature of about 250° C.

Drying the transition metal oxide may be carried out for a time period which is sufficient to vaporize moisture that is adsorbed on the transition metal oxide. This may comprise maintaining the drying temperature for at least 10 minutes, such as at least 15 minutes, at least 30 minutes, at least 60 minutes, or for a time period in the range of about 10 minutes to about 60 minutes, about 10 minutes to about 30 minutes, or about 10 minutes to about 15 minutes.

In various embodiments, heating the chalcogen source for vaporizing the chalcogen source may be carried out at any suitable temperature depending on the type of chalcogen source, and may, for example, be in the range of about 100° C. to about 300° C., such as in the range of about 150° C. to about 300° C., about 200° C. to about 300° C., about 250° C. to about 300° C., about 100° C. to about 250° C., about 100° C. to about 200° C., about 100° C. to about 150° C., about 110° C. to about 130° C., or about 120° C.

In some embodiments, the temperature for vaporizing the chalcogen source ranges from 110° C. to 300° C. In specific embodiments, the temperature for vaporizing the chalcogen source is 120° C.

Heating the chalcogen source may comprise maintaining the temperature for at least 12 minutes, such as at least 15 minutes, at least 30 minutes, at least 60 minutes, or for a time period in the range of about 12 minutes to about 60 minutes, about 12 minutes to about 30 minutes, or about 12 minutes to about 15 minutes.

In various embodiments, generating vapors of the transition metal oxide and vapors of the chalcogen source comprises heating the transition metal oxide and the chalcogen source simultaneously. This means that heat may be applied to both the transition metal oxide and the chalcogen source at the same time, albeit possibly at different temperatures for generating the vapors, so that the generated vapors may be disposed on the substrate and react to form the transition metal dichalcogenide layer. The time period for heating the transition metal oxide and the chalcogen source may be varied to form varying thickness of transition metal dichalcogenide layer on the substrate.

In various embodiments, the chalcogen source and the transition metal oxide may be arranged relative to each other such that the chalcogen source is located at the same distance to, or upstream to the transition metal oxide. This may mean that distance between the substrate and the transition metal oxide is at least the same or shorter than the distance between the substrate and the chalcogen source. Advantageously, as the transition metal oxide may generally be vaporized at a higher temperature as compared to the chalcogen source, a shorter travel distance for vapors of the transition metal oxide to the substrate may minimize temperature drop of the transition metal oxide vapors prior to disposing on the substrate. Even though there may be a longer travel distance of the vapors of chalcogen source to the substrate, the chalcogen source may nevertheless be maintained in the vapor form due to heat exchange between vapors of the chalcogen source with that of the transition metal oxide.

In various embodiments, generating vapors of the transition metal oxide and vapors of the chalcogen source comprises heating the transition metal oxide and the chalcogen source at a pressure ranging from about 0.1 Torr (0.0133 KPa) to about 20 Torr (2.67 KPa). For example, the pressure may range from about 0.5 Torr to about 20 Torr, such as about 1 Torr to about 20 Torr, about 5 Torr to about 20 Torr, about 10 Torr to about 20 Torr, about 0.1 Torr to about 15 Torr, about 0.1 Torr to about 10 Torr, about 5 Torr to about 15 Torr, or about 5 Torr to about 10 Torr.

In various embodiments, generating vapors of the transition metal oxide and vapors of the chalcogen source comprises maintaining the non-gaseous chalcogen scavenger in a non-gaseous state. This may mean adopting processing conditions which do not cause the non-gaseous chalcogen scavenger to vaporise or decompose.

The method according to various embodiments comprises disposing the vapors generated from the transition metal oxide and the chalcogen source on the substrate.

In various embodiments, disposing the vapors generated from the transition metal oxide and the chalcogen source on the substrate comprises directing a flow of inert gas at the vapors toward the substrate. The inert gas may, for example, comprise argon and/or nitrogen. Advantageously, this may improve processing efficiency due to the directed flow of vapors towards the substrate. The inert gas may have any suitable flow rate, such as a flow rate in the range of about 10 sccm to about 200 sccm, such as a flow rate of about 50 sccm to about 200 sccm, about 75 sccm to about 200 sccm, about 100 sccm to about 200 sccm, about 150 sccm to about 200 sccm, about 10 sccm to about 150 sccm, about 10 sccm to about 125 sccm, about 10 sccm to about 100 sccm, about 25 sccm to about 75 sccm, or about 50 sccm.

The method according to various embodiments comprises reacting the vapors of the transition metal oxide and the chalcogen source on the substrate to obtain the transition metal dichalcogenide layer on the substrate.

Reaction temperature to form the transition metal dichalcogenide layer may be in the range of about 650° C. to about 950° C., such as about 700° C. to about 950° C., about 750° C. to about 950° C., about 800° C. to about 950° C., about 650° C. to about 900° C., about 700° C. to about 900° C., about 700° C. to about 800° C., about 740° C. to about 760° C., or about 750° C.

In various embodiments, the method disclosed herein further comprises cooling the substrate after reacting vapors of the transition metal oxide and vapors of the chalcogen source.

As mentioned above, the method disclosed herein may be carried out in an inert environment. To this end, the method may be carried out in an enclosure or a chamber, so as to provide the inert environment and/or improve process control.

In various embodiments, providing the transition metal oxide, the chalcogen source, the non-gaseous chalcogen scavenger, and the substrate, comprises placing the transition metal oxide in a chamber, wherein the chamber has an opening for the non-gaseous chalcogen scavenger to be disposed thereat. The chamber may, for example, be a chamber with only one opening, and the non-gaseous chalcogen scavenger is disposed at the only one opening. The chalcogen source, on the other hand, may be placed upstream to the chamber containing the non-gaseous chalcogen scavenger and the transition metal oxide.

Providing the transition metal oxide, the chalcogen source, the non-gaseous chalcogen scavenger, and the substrate, may comprise positioning the opening of the chamber to face away from the chalcogen source.

In various embodiments, providing the transition metal oxide, the chalcogen source, the non-gaseous chalcogen scavenger, and the substrate, comprises disposing the chalcogen source at a distance of at least about 100 mm from the opening of the chamber, such as at least about 200 mm, at least about 300 mm, at least about 400 mm, at least about 500 mm, or about 150 mm to about 300 mm, about 200 mm to about 300 mm, about 100 mm to about 250 mm, about 100 mm to about 200 mm, or about 150 mm to about 250 mm to the opening.

By placing the transition metal oxide in the chamber and the non-gaseous chalcogen scavenger at an opening of the chamber, this may allow preferential access of the non-gaseous chalcogen scavenger, as compared to the transition metal oxide, to vapors of the chalcogen source, so that the non-gaseous chalcogen scavenger may act as a trap to react with the chalcogen vapors, thereby preventing premature reduction of the transition metal oxide. In so doing, consistency in supply of the transition metal oxide vapor to the substrate may be improved, and which may be sustained throughout the transition metal dichalcogenide layer growth process.

In various embodiments, generating vapors of the transition metal oxide and vapors of the chalcogen source comprises preventing vapors of the chalcogen source from reacting with the transition metal oxide prior to disposing the vapors of the transition metal oxide and vapors of the chalcogen source on the substrate. Preventing vapors of the chalcogen source from reacting with the transition metal oxide may, for example, comprise disposing a physical barrier between the transition metal oxide and the chalcogen source.

In embodiments whereby a chamber is present, the physical barrier may comprise or be in the form of a closed end of the chamber, and which may be positioned opposite to the opening. As the non-gaseous chalcogen scavenger is arranged at the opening of the chamber while the transition metal oxide is contained within it, vapors from the chalcogen source located outside of the chamber may be prevented from accessing the pre-vaporized transition metal oxide via the physical barrier, which may act in tandem with the non-gaseous chalcogen scavenger, to prevent premature reduction of the pre-vaporized transition metal oxide.

In various embodiments, providing the transition metal oxide, the chalcogen source, the non-gaseous chalcogen scavenger, and the substrate, comprises disposing the non-gaseous chalcogen scavenger at a distance of about 50 mm to about 150 mm from the chalcogen source, such as about 75 mm to about 150 mm, about 100 mm to about 150 mm, about 50 mm to about 125 mm, about 50 mm to about 100 mm, or about 75 mm to about 125 mm from the chalcogen source.

In some embodiments, the chamber is a quartz tube, such as that used in the examples.

As mentioned above, the substrate is disposed downstream of the transition metal oxide and the chalcogen source. In various embodiments whereby a chamber is being used, providing the transition metal oxide, the chalcogen source, the non-gaseous chalcogen scavenger, and the substrate, may comprise disposing the substrate in the proximity of the chamber.

For example, the substrate may be disposed at a distance from the opening of the chamber which allows access of the vapor generated from the transition metal oxide to the substrate. This may be a distance of at least about 5 mm from the opening, and/or at most about 80 mm from the opening. For example, the substrate may be disposed at a distance of about 5 mm to about 80 mm from the opening, such as about 10 mm to about 80 mm, about 20 mm to about 80 mm, about 30 mm to about 80 mm, about 50 mm to about 80 mm, about 5 mm to about 70 mm, about 5 mm to about 60 mm, about 5 mm to about 50 mm, about 40 mm to about 60 mm, or about 50 mm from the opening.

In various embodiments, providing the transition metal oxide, the chalcogen source, the non-gaseous chalcogen scavenger, and the substrate, comprises positioning the substrate in front of or directly in front of the opening of the chamber to maximize exposure of a surface area of the substrate to the opening from which vapor of the transition metal oxide flows through.

In various embodiments, providing the transition metal oxide, the chalcogen source, the non-gaseous chalcogen scavenger, and the substrate, comprises disposing the non-gaseous chalcogen scavenger upstream of the transition metal oxide with respect to flow of vapor from the chalcogen source. In other words, the non-gaseous chalcogen scavenger may be in contact with the vapor from the chalcogen source, thereby removing it, before it reaches the transition metal oxide.

In addition to or independently from the above, the non-gaseous chalcogen scavenger may be disposed downstream of the transition metal oxide with respect to flow of vapor from the transition metal oxide. This may mean arranging the non-gaseous chalcogen scavenger between the substrate and the transition metal oxide, so that vapor generated from the transition metal oxide passes by the non-gaseous chalcogen scavenger prior to being deposited on the substrate.

Accordingly, in some embodiments, providing the transition metal oxide, the chalcogen source, the non-gaseous chalcogen scavenger, and the substrate, comprises disposing the non-gaseous chalcogen scavenger in the proximity of the opening after placing the transition metal oxide in the chamber.

Various embodiments refer in a second aspect to an arrangement for forming a transition metal dichalcogenide layer on a substrate. Examples of suitable transition metal dichalcogenide and substrate have already been discussed above.

In various embodiments, the transition metal dichalcogenide is a disulfide, a diselenide, and/or a ditelluride of a transition metal, such as a metal selected from Group 4, Group 6, or Group 14 of the Periodic Table of Elements.

In some embodiments, the transition metal dichalcogenide is selected from the group consisting of molybdenum disulfide ($MoS_2$), tungsten disulfide ($WS_2$), chromium disulfide ($CrS_2$), titanium disulfide ($TiS_2$), hafnium disulfide ($HfS_2$), zirconium disulfide ($ZrS_2$), tin disulfide ($SnS_2$), and a combination thereof. In specific embodiments, the transition metal dichalcogenide layer comprises molybdenum sulfide.

The arrangement according to various embodiments may comprise a transition metal oxide and a chalcogen source, and a substrate which is disposed downstream of the transition metal oxide and the chalcogen source. Examples of suitable transition metal oxide, chalcogen source, and substrate have already been mentioned above.

In various embodiments, the transition metal oxide may be an oxide of one or more of the above-mentioned transition metal that is used to form the transition metal dichalcogenide layer, and may, for example, be an oxide of a metal selected from Group 4 to 6 or Group 14 of the Periodic Table of Elements, such as an oxide of molybdenum, tungsten, chromium, titanium, hafnium, zirconium, and/or tin.

In some embodiments, the transition metal oxide is selected from the group consisting of molybdenum oxide, tungsten oxide, chromium oxide, tin oxide, titanium dioxide, hafnium oxide, zirconium oxide, and a combination thereof.

In specific embodiments, the transition metal oxide comprises molybdenum oxide, tungsten oxide, or a combination thereof.

In various embodiments, the transition metal oxide comprises a transition metal trioxide. For forming a transition metal dichalcogenide layer comprising molybdenum disulfide ($MoS_2$), for example, the transition metal oxide may comprise or consist of molybdenum trioxide ($MoO_3$).

In various embodiments, the chalcogen source comprises sulfur, selenium, tellurium, or a combination thereof. In some embodiments, the chalcogen source comprises or consists of sulfur.

In various embodiments, the substrate comprises sapphire, silicon, silicon dioxide, gallium nitride, aluminium nitride, a metallic substrate such as copper, a ceramic substrate such as mica, or a combination thereof. In some embodiments, the substrate comprises or consists of sapphire, silicon, and/or silicon dioxide.

The arrangement according to embodiments disclosed herein comprises a non-gaseous chalcogen scavenger disposed in proximity to the transition metal oxide. In some embodiments, the non-gaseous chalcogen scavenger is disposed between the substrate and the chalcogen source. Examples of suitable non-gaseous chalcogen scavenger have already been mentioned above.

In various embodiments, the non-gaseous chalcogen scavenger comprises or consists of nickel.

In various embodiments, the non-gaseous chalcogen scavenger is a solid, and may furthermore be in the form of a powder or a foam.

In various embodiments, the arrangement further comprises an inert gas source adapted to provide an inert gas flow towards the substrate, wherein the chalcogen source is disposed in the path of the inert gas flow from the inert gas source towards the substrate. Examples of an inert gas have already been discussed above, and may comprise argon and/or nitrogen, for example.

The non-gaseous chalcogen scavenger may be disposed upstream of the transition metal oxide with respect to intended flow of vapor from the chalcogen source.

In various embodiments, the arrangement further comprises a physical barrier disposed between the transition metal oxide and the chalcogen source. The physical barrier may function to prevent vapors of the chalcogen source from reacting with the pre-vaporized transition metal oxide. For example, the physical barrier may prevent vapors of the chalcogen source from accessing the transition metal oxide prior to accessing the non-gaseous chalcogen scavenger. The physical barrier may be provided for by a chamber having an opening, wherein the transition metal oxide is disposed at a closed end of the chamber and the non-gaseous chalcogen scavenger is disposed at the opening of the chamber. The closed end of the chamber may be positioned opposite to the opening. In some embodiments, the chamber has only one opening.

The transition metal oxide may be disposed in the chamber while the non-gaseous chalcogen scavenger may be disposed at the opening. In some embodiments, the non-gaseous chalcogen scavenger is disposed in the proximity of the opening. The opening of the chamber may be positioned to face away from the chalcogen source. The chalcogen source, on the other hand, may be placed outside of and upstream to the chamber containing the non-gaseous chalcogen scavenger and the transition metal oxide.

As the non-gaseous chalcogen scavenger is arranged at the opening of the chamber while the transition metal oxide is contained within it, vapors from the chalcogen source located outside of the chamber may be prevented from accessing the pre-vaporized transition metal oxide via the physical barrier, which may act in tandem with the non-gaseous chalcogen scavenger, to prevent premature reduction of the pre-vaporized transition metal oxide.

In various embodiments, the arrangement is disposed in an enclosure. Advantageously, the enclosure may allow an inert environment to be provided for the arrangement. The chamber, if present, may be arranged within the enclosure.

As the transition metal oxide and the chalcogen source may be vaporized at different temperatures, the arrangement may further comprise a respective heating element adapted to independently provide heat to the transition metal oxide and the chalcogen source for vaporizing the transition metal oxide and the chalcogen source. Two or more heating elements may allow the transition metal oxide and the chalcogen source to be heated to different temperatures. In some embodiments, the respective heating element allows heating of the transition metal oxide and the chalcogen source to be carried out simultaneously, which may in turn allow vapors of the transition metal oxide and the chalcogen source to be generated in a consistent manner for reacting and forming a transition metal dichalcogenide layer on the substrate.

In various embodiments, the chalcogen source is disposed at a distance of at least about 100 nm from the opening of the chamber, such as at least about 150 nm, at least about 200 nm, at least about 250 nm, or about 150 mm to about 300 mm, about 200 mm to about 300 mm, about 100 mm to about 250 mm, about 100 mm to about 200 mm, or about 150 mm to about 250 mm from the opening.

In various embodiments, the non-gaseous chalcogen scavenger is disposed at a distance of about 50 mm to about 150 mm from the chalcogen source, such as about 75 mm to about 150 mm, about 100 mm to about 150 mm, about 50 mm to about 125 mm, about 50 mm to about 100 mm, or about 75 mm to about 125 mm from the chalcogen source.

In some embodiments, the chamber is a quartz tube, such as a closed end quartz tube.

As mentioned above, the substrate is disposed downstream of the transition metal oxide and the chalcogen source. In various embodiments whereby a chamber is being used, providing the transition metal oxide, the chalcogen source, the non-gaseous chalcogen scavenger, and the substrate, may comprise disposing the substrate in the proximity of the chamber.

The substrate may be disposed at a distance from the transition metal oxide to allow access of the vapor generated from the transition metal oxide to the substrate. In various embodiments, the substrate is disposed at about 5 mm to about 80 mm from the transition metal oxide. In embodiments whereby a chamber is used, this may be measured by a distance of the substrate from the opening of the chamber which allows access of the vapor generated from the transition metal oxide to the substrate. This may be a distance of at least about 5 mm from the opening, and/or at most about 80 mm from the opening. Suitable distances have already been discussed above.

In various embodiments, the substrate is positioned in front of or directly in front of the opening of the chamber to maximize exposure of a surface area of the substrate to the opening from which the vapor of the transition metal oxide is channelled.

In order that the invention may be readily understood and put into practical effect, particular embodiments will now be described by way of the following non-limiting examples.

EXAMPLES

Various examples provided herein relate to provision of a non-gaseous chalcogen scavenger to limit reduction of transition metal oxide by vapors of a chalcogen source, prior to vaporization of the transition metal oxide.

This has been proven and demonstrated using a Ni based sulfur trap in a closed cylindrical tube containing the $MoO_3$ precursor as an exemplary embodiment. The sulfur trap acts as the non-gaseous chalcogen scavenger whereas the closed cylindrical tube acts as a physical barrier for additional protection. Using the set-up, sulfur exposure to the $MoO_3$ may be minimized before it evaporates and reacts to form $MoS_2$. The Ni foam/powder may act as a trap to react with sulfur, preventing premature reduction of the $MoO_3$ precursor. This setup allows a consistent $MoO_3$ precursor supply throughout the growth process. The nickel sulfide by-product also does not evaporate at the process temperature, thereby not introducing foreign elements into the final product.

To realize commercial applications for 2D materials like $MoS_2$, large area wafer scale growth is required. Uniform growth may be realized by MOCVD with gas phase precursors; however, grain size is small and growth time is long.

Powder based precursors such as $MoO_3$ and S can produce films with much larger grain size via CVD growth; however, concentration gradient of reactants means that uniform growth can be achieved only across centimeter scale.

Using this technology with appropriate distances between substrate, precursors as well as temperature and pressure conditions, the inventors deposited a homogeneous single layer $MoS_2$ over a 2 inch sapphire wafer. Photoluminescence (PL) and Raman spectroscopy measurements also confirmed that a single layer $MoS_2$ was deposited over the entire wafer. In a generic setup with no Ni foam nor closed end quartz tube, deposition was inhomogeneous and the same coverage was not obtained.

Various embodiments relate to a growth process/setup having the following key features (1) to (3) to achieve the following requirements (a) to (c):

Key Features:
(1) A material such as Ni foam or Ni powder to react with oncoming sulfur.
(2) Closed end quartz cylinder to prevent direct exposure of $MoO_3$ to sulfur.
(3) Low pressure, high temperature growth procedure.

Requirements:
(a) Reduction in sulfurization of $MoO_3$, resulting in more effective evaporation.
(b) Deposition of wafer-scale homogenous 2D $MoS_2$ on sapphire.
(c) Confirmation of single layer $MoS_2$ using Raman and photoluminescence measurements.

The technological concept of a sulfur trap in combination with a physical barrier to limit reduction of oxide precursor for $MoS_2$, such as $MoO_3$ powder, is a key novelty according to embodiments disclosed herein, which was demonstrated herein via the use of Ni (foam or powder form) in combination with a closed end cylinder as it enables efficient trapping of sulfur through a Ni sulfur reaction to allow consistent precursor supply for deposition of $MoS_2$.

Advantageously, methods disclosed herein involve use of non-toxic powder precursors such as $MoO_3$ and sulfur. There is also short growth time of about 13 minutes, and there is no need to introduce oxygen gas into the reactor. Methods disclosed herein may be used to form large area MoS$_2$ films for flexible electronics and neuromorphic computing applications.

Example 1: Design Concept

In MoO$_3$ and sulfur based chemical vapor deposition process, the solid MoO$_3$ powder can get reduced by sulfur vapor prior to evaporation, hypothesized as the following reaction:

$$MoO_3+(x/2)S \rightarrow MoO_{3-x}+(x/2)SO_2$$

The reduced solid product did not evaporate well, thereby limiting amount of MoO$_3$ present to react with S to form the desired MoS$_2$ product.

Herein, the inventors' concept involves a) a physical barrier to limit exposure of the MoO$_3$ powder and more importantly b) a sulfur trap to capture the sulfur vapor. The sulfur trap used should chemically react with sulfur to function as a trap and the resultant product has to remain non-volatile throughout the growth process to minimize contamination of the desired MoS$_2$. This concept is proven using a closed end quartz tube (physical barrier) and nickel (Ni) (sulfur trap element that is non-volatile at the process temperature).

Example 2: Process Parameters and Chemical Reagents

The process parameters for chemical vapor deposition of MoS$_2$ homogenously over an area larger than 1 cm$^2$ are described herein.
1. A tube closed at one end to contain the MoO$_3$ powder.
2. A minimum of 10 mg of MoO$_3$.
3. A sulfur reacting material placed at the mouth of the tube.
4. Substrate (such as sapphire, silicon dioxide (SiO$_2$)) placed vertically, facing the open tube end.
5. A minimum of 1 g of sulfur placed in a separate heating zone from MoO$_3$.
6. An inert carrier gas (such as argon (Ar) or nitrogen (N$_2$)) flow for vapor transport.
7. A chamber pressure in the range of 0.1 Torr to 20 Torr.
8. A sublimation temperature in the range of 650° C. to 900° C. for MoO$_3$, 100° C. to 300° C. for sulfur, and a substrate temperature of 650° C. to 950° C.

Example 3: Physical Setup

A detailed description of an example process demonstrating the concept for depositing MoS$_2$ over a 2 inch sapphire wafer is provided below.

A closed end quartz cylindrical tube (37 mm inner diameter, 150 mm length) was loaded with 40 mg of MoO$_3$ at the closed end (FIG. 1A and FIG. 1B), and a Ni foam (440 mg) was placed close to the mouth of the tube. The Ni foam may be substituted with Ni powder of equivalent weight to be placed at the same location.

Sapphire was placed vertical on a wafer rack and loaded at a distance of about 50 mm away from the mouth of cylinder. Sulphur (1 g) was located 300 mm away from the entire setup and placed in a separate heating zone. All of the above were kept in a 5 inch inner diameter quartz tube heating furnace.

Example 4: Chemical Vapor Deposition Process

Figure 1B:
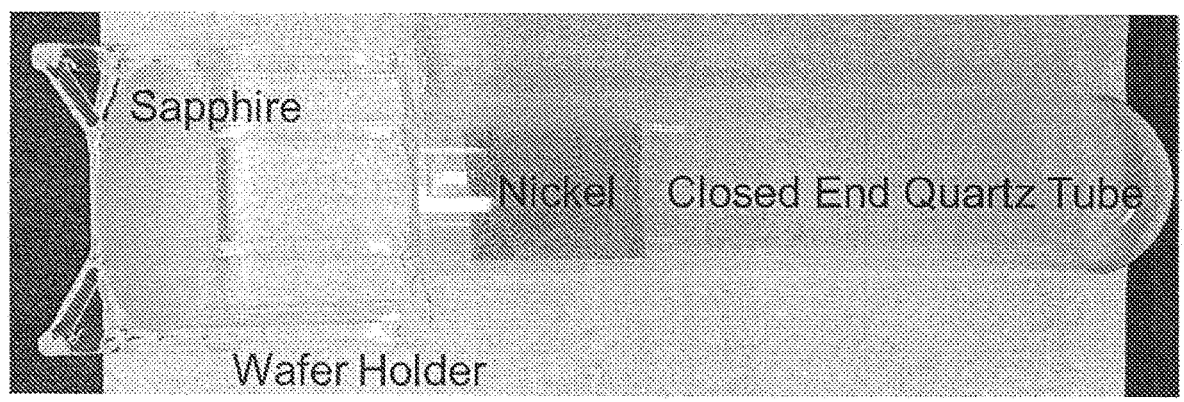
FIG. 1B is a photograph showing an arrangement which may be used for forming a transition metal dichalcogenide layer on a substrate according to embodiments disclosed herein. The arrangement may be used as a set-up for placing within a furnace. Nickel is an example of a non-gaseous chalcogen scavenger; and sapphire is an example of a substrate, which is being held by a wafer holder. As shown, the nickel is disposed at an opening of the quartz tube, while $MoO_3$ may be placed at a portion of the quartz tube proximal to its closed end. The closed end of the quartz tube is able to function as a physical barrier to block sulfur vapor, so that direct exposure of $MoO_3$ to sulfur may be prevented.
Figure 1C:
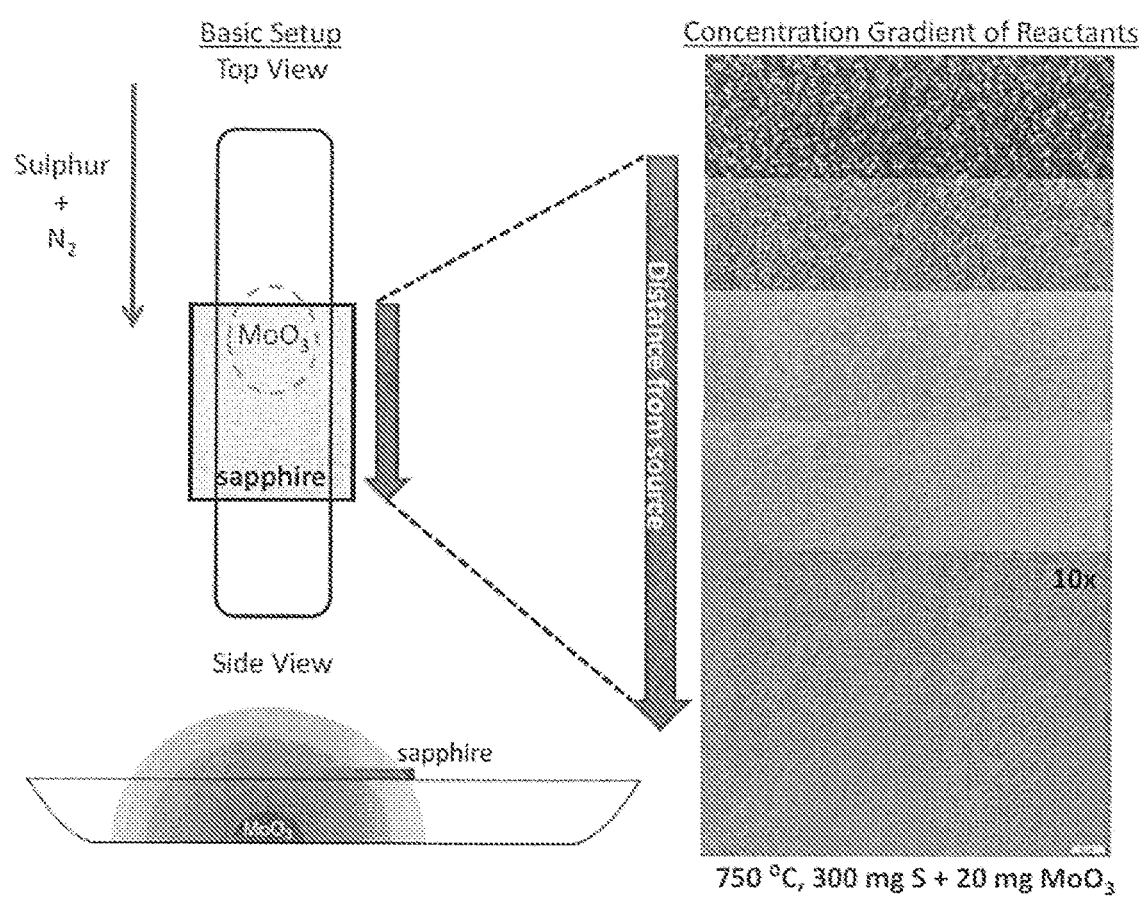
FIG. 1C is a schematic diagram showing a conventional arrangement for forming a transition metal dichalcogenide layer ($MoS_2$) on a substrate. The sapphire substrate was placed directly over the transition metal oxide source, MoO$_3$. Due to the close proximity of the sapphire substrate to the transition metal oxide source, MoO$_3$, the concentration gradient of reactants decreased rapidly across the length of the substrate, which resulted in non-uniformity of the MoS$_2$ layer. Advantageously, embodiments disclosed herein, including specific embodiments as shown in FIG. 1A and FIG. 1B, are able to overcome this issue.

The heating profile used for the two individual heating zones, labeled upstream and downstream in FIG. 1A, is listed below. Gas flow speed was set at 50 sccm of Ar and pressure of the system was regulated at 1 Torr during the growth process.

4.1 Upstream
1. No heating for first 15 minutes.
2. Ramp up to 120° C. over 8 minutes.
3. Maintain temperature over 12 minutes.
4. Cut off power supply to furnace heaters.
5. Furnace covers are open at 650° C. to expose tube exterior to ambient for cooling and Ar flow increased to 200 sccm.

4.2 Downstream
1. Ramp up to 250° C. over 5 minutes.
2. Maintain temperature for 10 minutes.
3. Ramp up to 750° C. over 12 minutes.
4. Maintain temperature for 13 minutes.
5. Cut off power supply to furnace heaters.
6. Furnace covers are open at 650° C. to expose tube exterior to ambient for cooling.

Figure 2A:
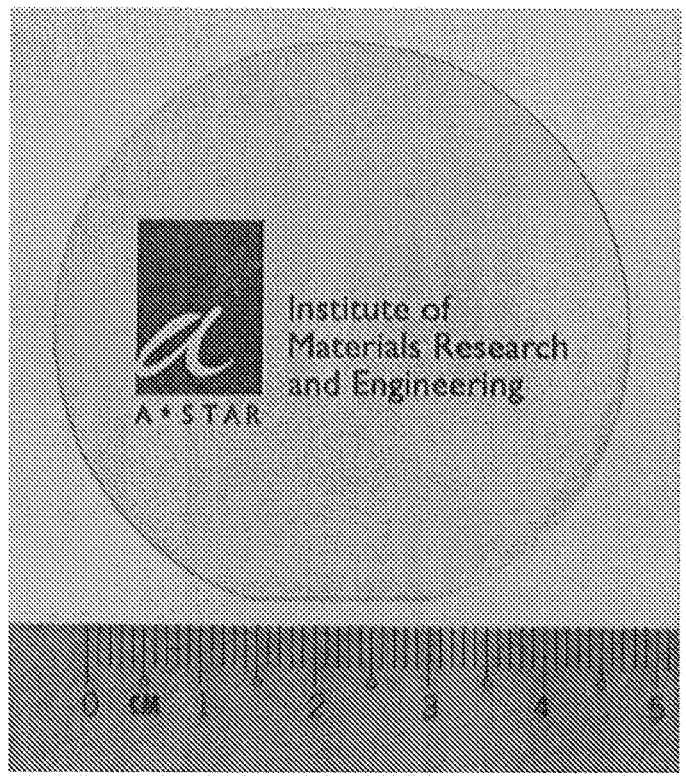
FIG. 2A is a photograph showing a MoS$_2$ single layer deposited over a 2 inch sapphire wafer.
Figure 2B:
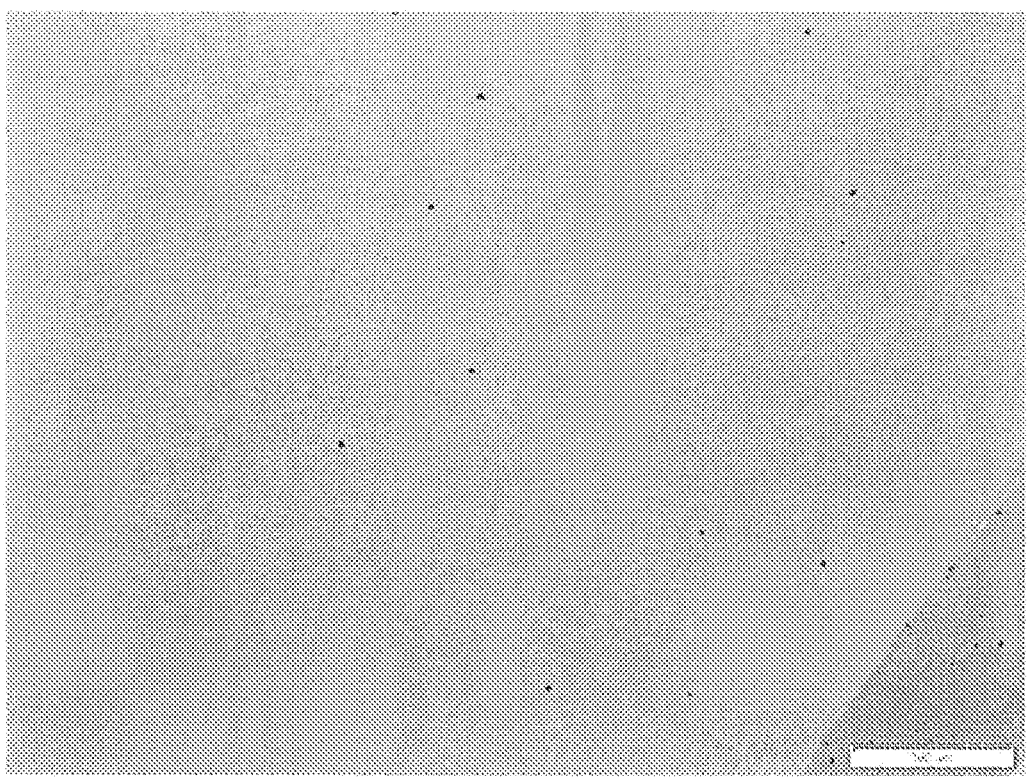
FIG. 2B is an optical microscopy image showing a MoS$_2$ single layer deposited over a sapphire wafer, whereby bottom right corner of the image shows a portion of the sapphire wafer which was scratched to expose underlying sapphire wafer surface. As can be seen, there exists optical contrast between MoS$_2$ and exposed sapphire surface. Scale bar in the figure denotes 100 µm.

The MoS$_2$ covered sapphire was removed when the tube has cooled down to room temperature. The yellow MoS$_2$ single layer deposited on a 2 inch sapphire is shown in FIG. 2A. Visual inspection yielded a homogenous coverage over the entire wafer, except the edges where the holder physically obstructed the wafer.

Figure 3:
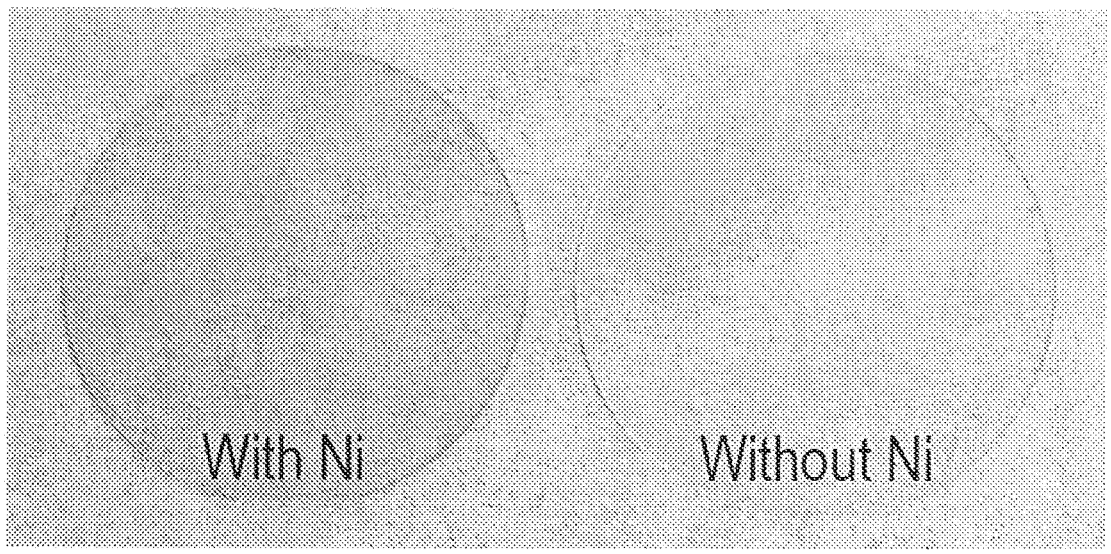
FIG. 3 is a photograph showing two sapphire wafers, with the left showing a single layer MoS$_2$ being deposited when Ni is present, and the right showing no MoS$_2$ being deposited when Ni is absent.
Figure 4A:
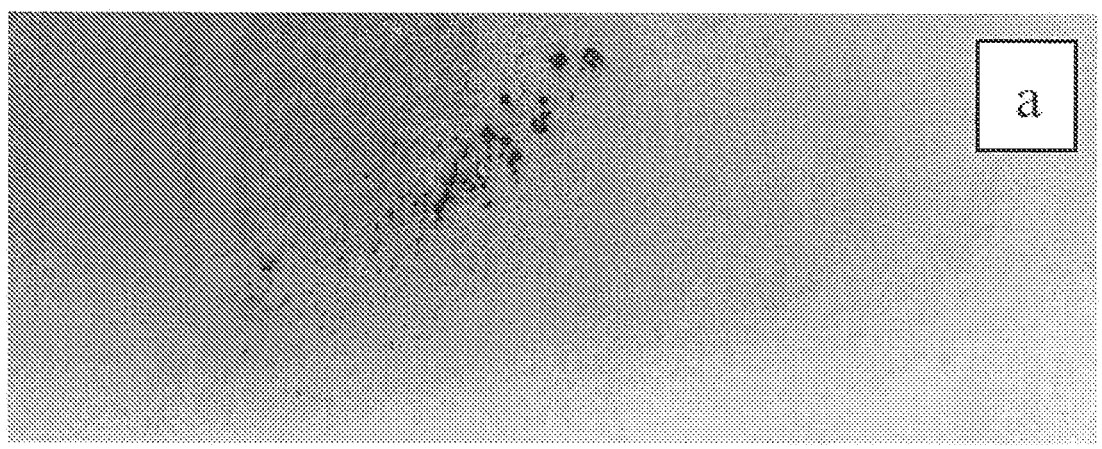
FIG. 4A is a photograph showing residual Mo oxide chemical reagent with Ni.
Figure 4B:
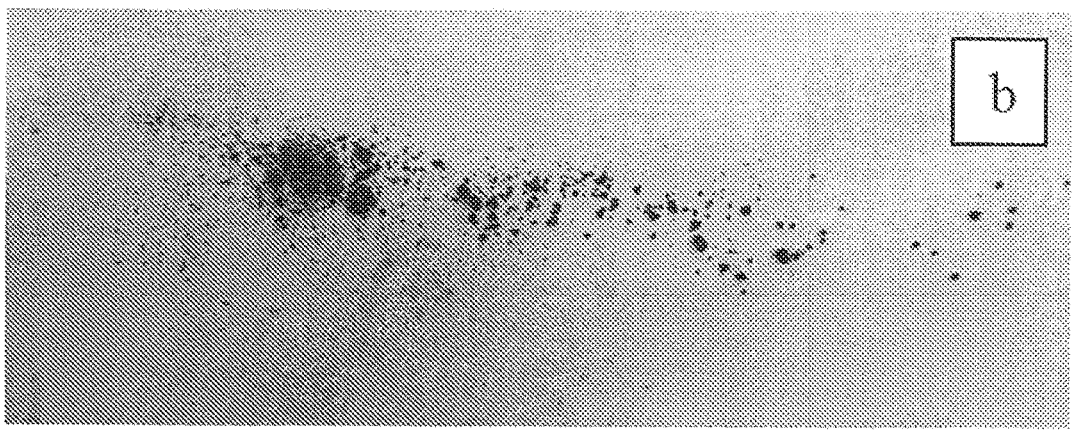
FIG. 4B is a photograph showing residual Mo oxide chemical reagent without Ni.
Figure 4C:
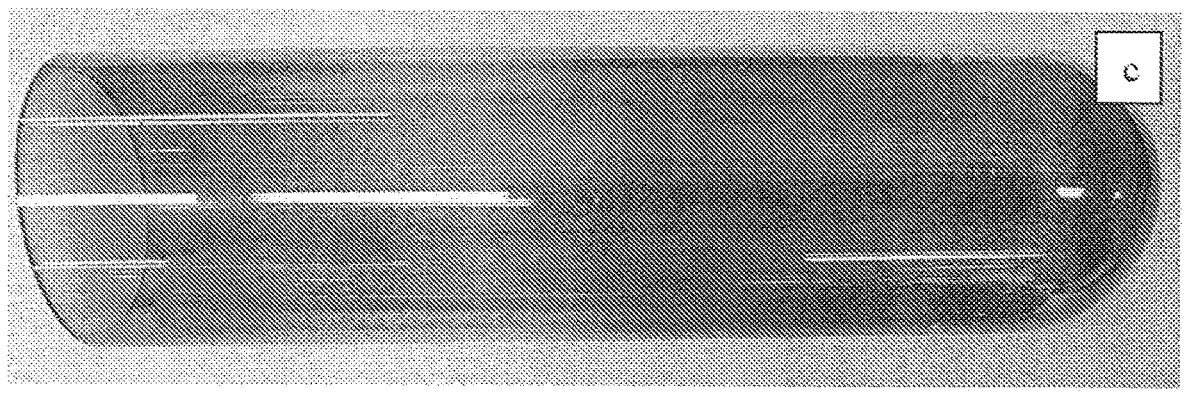
FIG. 4C is a photograph showing cylinder after growth process with Ni.
Figure 4D:
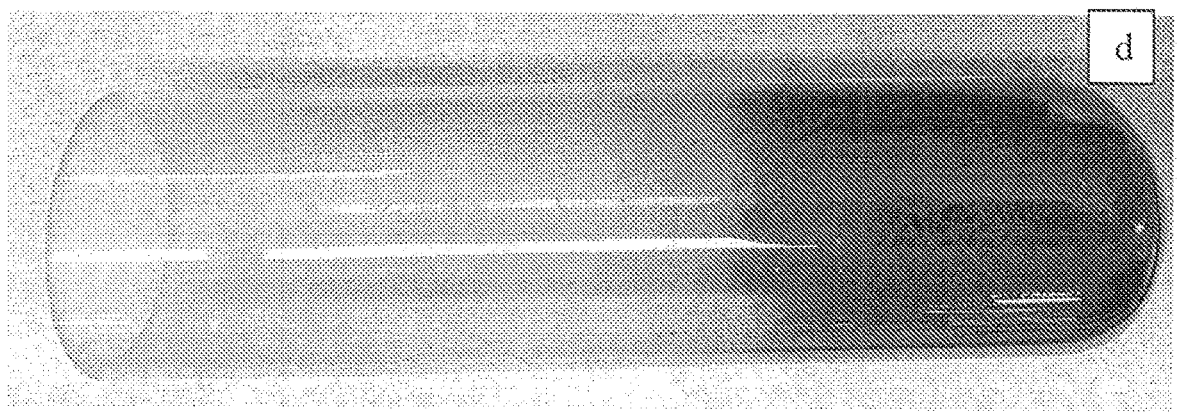
FIG. 4D is a photograph showing cylinder after growth process without Ni.
Figure 5A:
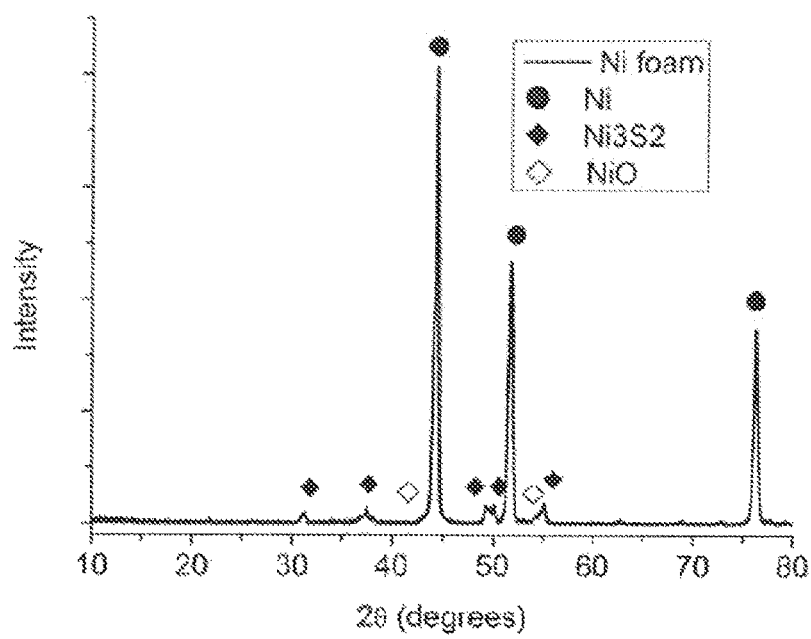
FIG. 5A is graph showing X-ray diffraction data of Ni foam acting as sulfur trap. The data are cross-referenced with the following powder diffraction files (PDF) from the JCPDS database: Ni (70-1849), Ni$_3$S$_2$ (44-1418), NiO (89-3080), MoO$_2$ (32-0671), MoO$_3$ (01-0706), Mo$_9$O$_{26}$ (12-0753), and Mo$_4$O$_{11}$ (72-0448).
Figure 5B:
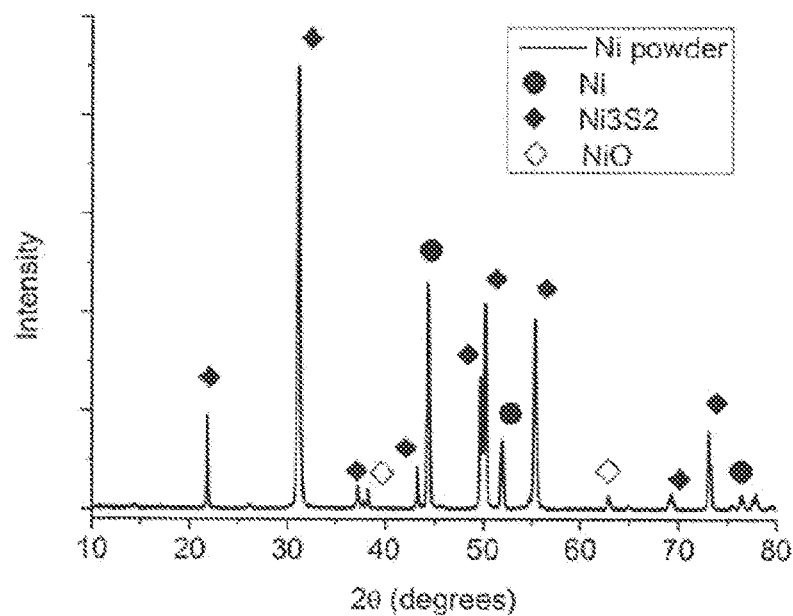
FIG. 5B is graph showing X-ray diffraction data of Ni powder acting as sulfur trap. The data are cross-referenced with the following powder diffraction files (PDF) from the JCPDS database: Ni (70-1849), Ni$_3$S$_2$ (44-1418), NiO (89-3080), MoO$_2$ (32-0671), MoO$_3$ (01-0706), Mo$_9$O$_{26}$ (12-0753), and Mo$_4$O$_{11}$ (72-0448).
Figure 5C:
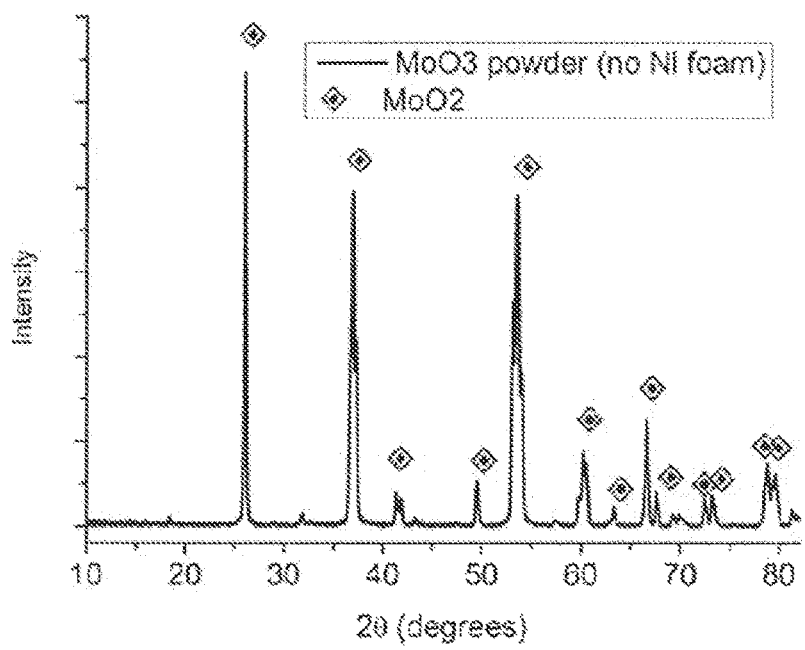
FIG. 5C is graph showing X-ray diffraction data of MoO$_3$ powder without Ni foam trap at the end of the growth process. The data are cross-referenced with the following powder diffraction files (PDF) from the JCPDS database: Ni (70-1849), Ni$_3$S$_2$ (44-1418), NiO (89-3080), MoO$_2$ (32-0671), MoO$_3$ (01-0706), Mo$_9$O$_{26}$ (12-0753), and Mo$_4$O$_{11}$ (72-0448).
Figure 5D:
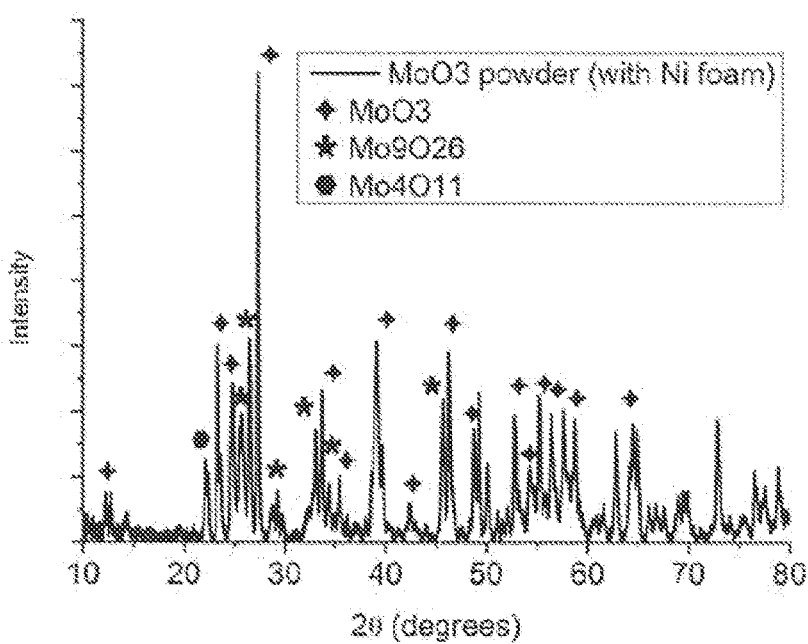
FIG. 5D is graph showing X-ray diffraction data of MoO$_3$ powder with Ni foam trap at the end of the growth process. The data are cross-referenced with the following powder diffraction files (PDF) from the JCPDS database: Ni (70-1849), Ni$_3$S$_2$ (44-1418), NiO (89-3080), MoO$_2$ (32-0671), MoO$_3$ (01-0706), Mo$_9$O$_{26}$ (12-0753), and Mo$_4$O$_{11}$ (72-0448).

Comparatively, a similar setup with the same amount of chemicals and physical setup but without Ni resulted in no deposition of MoS$_2$ (FIG. 3). Amount of residual Mo oxide powders after the reaction varied greatly with the presence/absence of Ni, as shown in FIG. 4A and FIG. 4B. In the presence of Ni, only 4.0 mg out of an original amount of 40.0 mg of MoO$_3$ remained while 12.6 mg of powder remained when no Ni was present. This observation indicated that the presence of Ni was necessary to ensure that sufficient supply of MoO$_3$ evaporated and reacted to form the desired MoS$_2$. Visually inspecting the cylinder containing the molybdenum oxides also painted the same picture (FIG. 4C and FIG. 4D). With Ni, the oxides may diffuse out of the cylinder but without Ni, the oxides barely reached the mid-section of the cylinder.

Example 5: X-Ray Diffraction (XRD) Studies

XRD was performed on the Ni foam/powder that served as the sulfur trap, as well as the residual MoO$_3$ powder left in the tube at the end of the growth process. This was done to gain insight into the growth mechanisms, and lend support and evidence to herein disclosed concept of using a sulfur trap to enable wafer scale MoS$_2$ growth. The XRD data are plotted as shown in FIG. 5A to FIG. 5D.

From the figure, it can be seen that a Ni$_3$S$_2$ phase existed in both the Ni foam and powder, indicating that both have been sulfurized. This nickel sulfide phase was the minority phase for the foam but became the dominant phase for the powder, suggesting that sulfurization of the powder was much more efficient due to the higher surface area.

As for the MoO$_3$ powder, it was completely reduced to MoO$_2$ in the absence of Ni. In contrast, for the MoO$_3$ powder with Ni foam as a sulfur trap, it was only slightly reduced as the dominant phase was still MoO$_3$ with some Mo$_9$O$_{26}$ and Mo$_4$O$_{11}$ present. This proved the efficacy of the Ni foam in serving as a sulfur trap and preventing the reduction of MoO$_3$.

From the above data, the following reaction mechanisms may be proposed to account for the results obtained:

$$3Ni + 2S \rightarrow Ni_3S_2$$

$$MoO_3 + (x/2)S \rightarrow MoO_{3-x} + (x/2)SO_2$$

In the presence of Ni in the form of foam or powder, the first reaction took place, consuming the sulfur and inhibited the second reaction. The reduced form $MoO_{3-x}$ is undesirable due to low vapor pressure.

Example 6: Raman Spectroscopy and Photoluminescence (PL) Measurements

Figure 6A:
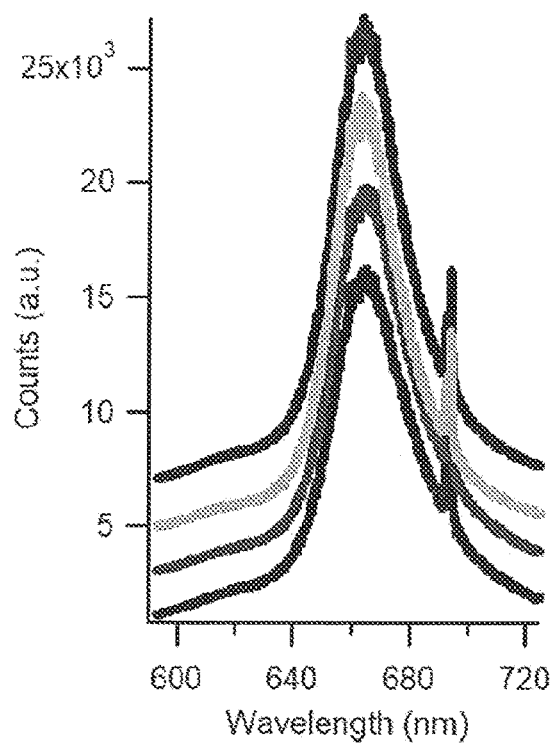
FIG. 6A is a graph showing photoluminescence (PL) of the 2 inch MoS$_2$ single layer taken at random locations.
Figure 6B:
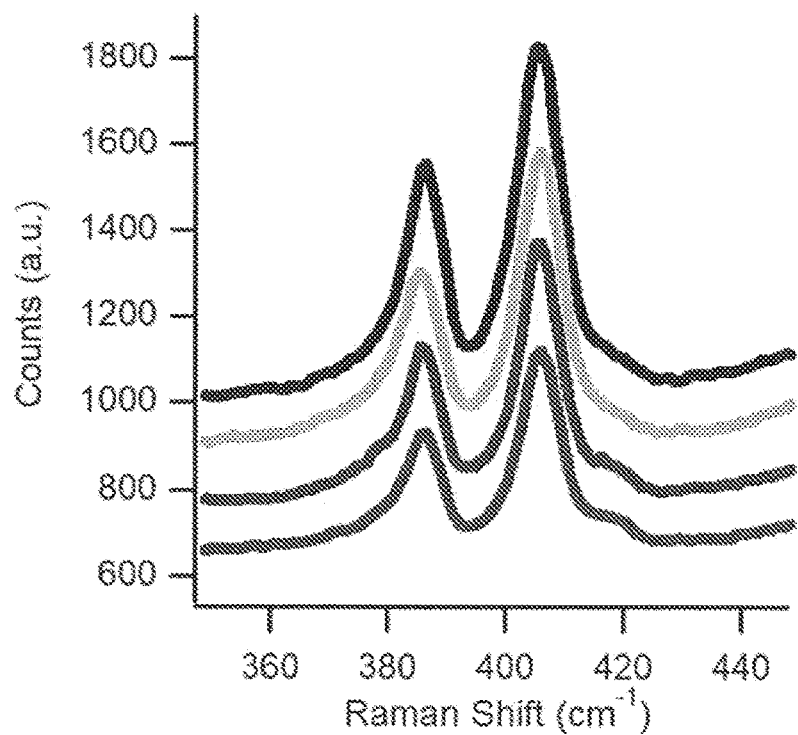
FIG. 6B is a graph showing Raman measurements of the 2 inch MoS$_2$ single layer taken at random locations.

Raman spectroscopy and photoluminescence was performed on the deposited $MoS_2$ to ascertain its homogeneity and layer number, using a 532 nm laser with power of less than 1 mW and a beam spot size of 0.5 μm. The layer number may be determined by the peak separation between two signature Raman peaks of $MoS_2$, namely the $E_{2g}$ and $A_{1g}$ peak. Since only single layer $MoS_2$ has a direct electronic band gap, it would yield a strong PL peak compared to thicker layers. The consistent Raman peak separation of 20 $cm^{-1}$ taken from random spots of the wafer indicated deposition of a monolayer over a sapphire wafer while the PL measurements yielded a characteristic strong PL peak (FIG. 6A and FIG. 6B).

Figure 7:
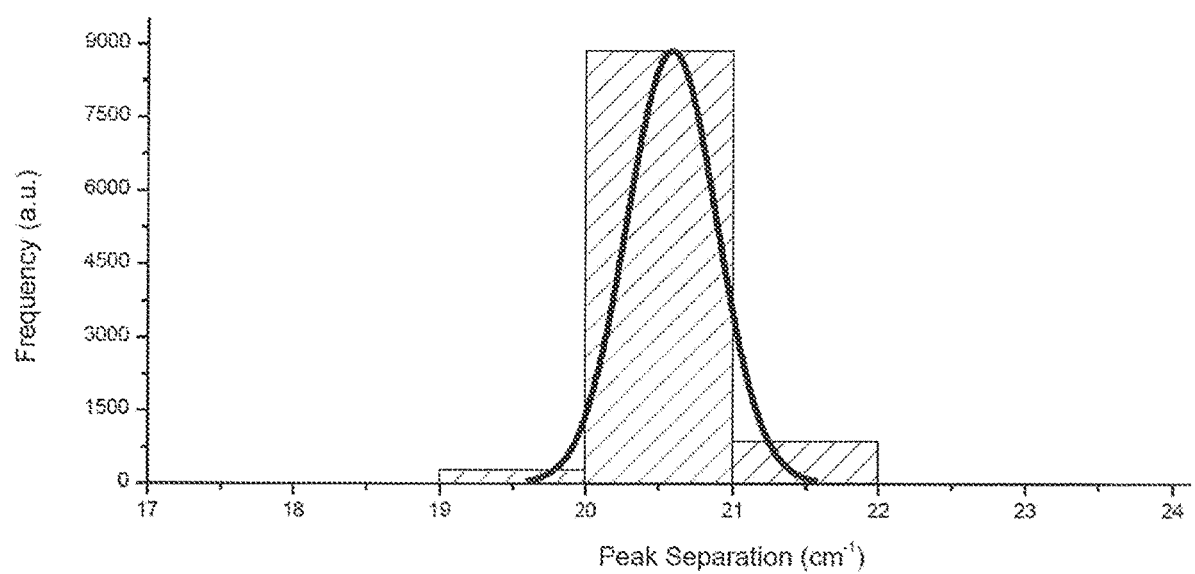
FIG. 7 is a graph showing histogram of peak separations ($E_{2g}$-$A_{1g}$) taken over a 20×20 µm$^2$ area.

The inventors verified the consistency of the layer growth by taking an additional ten thousand discrete Raman measurements taken over a 20×20 $\mu m^2$ area, which yielded consistent spread of 20±1 $cm^{-1}$ separation between the $E_{2g}$ and $A_{1g}$ Raman peaks (FIG. 7).

By "comprising" it is meant including, but not limited to, whatever follows the word "comprising". Thus, use of the term "comprising" indicates that the listed elements are required or mandatory, but that other elements are optional and may or may not be present.

By "consisting of" is meant including, and limited to, whatever follows the phrase "consisting of". Thus, the phrase "consisting of" indicates that the listed elements are required or mandatory, and that no other elements may be present.

The inventions illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

By "about" in relation to a given numerical value, such as for temperature and period of time, is meant to include numerical values within 10% of the specified value.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

The invention claimed is:

1. An arrangement for forming a transition metal dichalcogenide layer on a substrate, the arrangement comprising:
    a chamber for containing a transition metal oxide and a non-gaseous chalcogen scavenger, wherein the non-gaseous chalcogen scavenger is disposed in proximity to the transition metal oxide;
    a heating zone at which a chalcogen source is placed;
    a substrate holder adapted to have a substrate positioned downstream of the chamber so as to have the substrate disposed downstream of the transition metal oxide and the chalcogen source; and
    an inert gas source adapted to provide an inert gas flow towards the substrate holder, wherein the heating zone is positioned to have the chalcogen source disposed in a path of the inert gas flow from the inert gas source towards the substrate holder;
    wherein the chamber has a closed end and an opening opposite to the closed end, wherein the opening is adapted to have the non-gaseous chalcogen scavenger disposed at the opening and in the chamber and 10 cm or less away from the transition metal oxide, and wherein the closed end is configured as a physical barrier which is (i) disposed between the transition metal oxide and the chalcogen source, (ii) adapted to have the transition metal oxide disposed at the closed end of the chamber, (iii) adapted to prevent the inert gas flow from directly contacting the transition metal oxide and the non-gaseous chalcogen scavenger.

2. The arrangement of claim 1, wherein the arrangement further comprises a respective heating element adapted to independently provide heat to the transition metal oxide and the chalcogen source for vaporizing the transition metal oxide and the chalcogen source.

3. The arrangement of claim 1, wherein the closed end configured as the physical barrier is positioned away from the chalcogen source.

4. The arrangement of claim 1, wherein the arrangement is disposed in an enclosure.

5. The arrangement of claim 1, wherein the transition metal oxide is selected from the group consisting of molybdenum oxide, tungsten oxide, chromium oxide, tin oxide, titanium dioxide, hafnium oxide, zirconium oxide, and a combination thereof.

6. The arrangement of claim 1, wherein the chalcogen source comprises sulfur, selenium, tellurium, or a combination thereof.

7. The arrangement of claim 1, wherein the non-gaseous chalcogen scavenger comprises or consists of nickel.

8. The arrangement of claim 1, wherein the substrate comprises sapphire, silicon, silicon dioxide, gallium nitride, aluminium nitride, a metal, a ceramic, or a combination thereof.

* * * * *